(12) United States Patent
Sethumadhavan et al.

(10) Patent No.: US 12,028,056 B2
(45) Date of Patent: Jul. 2, 2024

(54) SYSTEMS AND METHODS FOR REDUCTION OF INDUCED GROUND BOUNCE VOLTAGE IN MOTOR DRIVERS

(71) Applicant: Texas Instruments Incorporated, Dallas, TX (US)

(72) Inventors: Sachin Sethumadhavan, Bangalore (IN); Ganapathi Shankar Krishnamurthy, Bangalore (IN)

(73) Assignee: Texas Instruments Incorporated, Dallas, TX (US)

(*) Notice: Subject to any disclaimer, the term of this patent is extended or adjusted under 35 U.S.C. 154(b) by 130 days.

(21) Appl. No.: 17/547,449

(22) Filed: Dec. 10, 2021

(65) Prior Publication Data

US 2023/0188133 A1 Jun. 15, 2023

(51) Int. Cl.
*H03K 17/16* (2006.01)
*H02P 6/18* (2016.01)
*H02P 29/024* (2016.01)
*H03K 17/687* (2006.01)
*H03K 19/003* (2006.01)

(52) U.S. Cl.
CPC ............ *H03K 17/163* (2013.01); *H02P 6/18* (2013.01); *H02P 29/0241* (2016.02); *H03K 17/687* (2013.01); *H03K 19/00361* (2013.01)

(58) Field of Classification Search
CPC . H02P 6/18; H02P 29/0241; H03K 19/00361; H03K 17/08122; H03K 17/163; H03K 17/165; H03K 17/063; H03K 17/687
See application file for complete search history.

(56) References Cited

U.S. PATENT DOCUMENTS

| 9,343,949 B2 | 5/2016 | Agarwal et al. | |
| 10,951,108 B1 | 3/2021 | He et al. | |
| 2008/0084197 A1* | 4/2008 | Williams | H02M 1/38 |
| | | | 323/282 |

FOREIGN PATENT DOCUMENTS

| JP | 2006121859 A | 5/2006 |
| JP | 2010130789 A | 6/2010 |
| WO | 2017181071 A1 | 10/2017 |

OTHER PUBLICATIONS

International Search Report in corresponding PCT Application No. PCT/US2022/052079, mailed Apr. 27, 2023. (4 pages).

(Continued)

*Primary Examiner* — Said Bouziane
(74) *Attorney, Agent, or Firm* — John R. Pessetto; Frank D. Cimino (57) ABSTRACT

A driver system operable to supply a drive signal to a motor includes a system input adapted to be coupled to an input voltage and a system output adapted to be coupled to the motor. The driver system includes a high-side transistor which has a first terminal coupled to the system input, a second terminal coupled to the system output, and has a control terminal. The driver system includes a low-side transistor which has a first terminal coupled to the system output, a second terminal coupled to a reference potential terminal, and has a control terminal. The driver system includes a low-side gate control circuit which provides a first level current responsive to a low-side digital control signal transitioning from a low state to a high state and provides a second level current if the output voltage is less than an upper reference voltage.

20 Claims, 4 Drawing Sheets

(56) References Cited

OTHER PUBLICATIONS

Machine Translation for JP2006121859.
Machine Translation for JP2010130789.

* cited by examiner

SYSTEMS AND METHODS FOR REDUCTION OF INDUCED GROUND BOUNCE VOLTAGE IN MOTOR DRIVERS

TECHNICAL FIELD

This description relates generally to motor drivers.

BACKGROUND

Electric motors are found in automobiles, industrial fans and pumps, machine tools, household appliances, drones, gimbles, and disk drives. An electric motor is generally run by a motor driver circuit which may include a high-side transistor and a low-side transistor arranged in a bridge configuration. In some configurations, a pair of high-side/low-side transistors is used for each phase of the motor. The high-side transistor is coupled between an input voltage terminal and an output voltage terminal, and the low-side transistor is coupled between the output voltage terminal and a common potential (e.g. ground) terminal. The high-side and low-side transistors have respective body diodes. When a motor driver circuit is implemented in an integrated circuit (IC), a bond wire inductance is present due to the bond wire which connects the input voltage terminal to an external connector (e.g., external pin of IC), and another bond wire inductance is present due to the bond wire which connects the ground terminal to an external connector.

When the low-side transistor is turned on, due to the reverse recovery time of the high-side body diode, current through the high-side body diode starts to decrease but continues to flow as current through the low-side transistor starts to increase. In order to completely reverse bias the high-side body diode to prevent current flowing through the high-side body diode, the low-side transistor draws current that may have a magnitude greater than the current through the motor (motor current "Im") in order to account for reverse recovery charge accumulated in the high-side body diode. As a result, current through the low-side transistor rises above the motor current Im, reaching a positive peak before falling to Im. Because the low-side transistor draws current greater than the motor current Im, a portion of the current through the low-side transistor is drawn from input voltage through the high-side body diode from the cathode to the anode (i.e., reverse direction). Thus, the current through the high-side body diode falls below zero, reaching a negative peak before rising to zero. The rising current through the low-side transistor induces a positive voltage across the bond wire inductance, and the falling current through the low-side transistor induces a negative voltage across the bond wire inductance. The induced voltages across the bond wire are generally referred to as a ground bounce voltage VB_INT.

Because the ground bounce voltage VB_INT is present at a source of the low-side transistor, VB_INT dictates the voltage that must be applied to a gate of the low-side transistor to turn on the low-side transistor. Also, VB_INT increases the voltage drop between a drain and a source of the low-side transistor.

If VB_INT is +5V, the driver circuit must apply (Vt+5V) to the gate to turn on the low-side transistor (Vt is the threshold voltage required to turn on the low-side transistor). Thus, if Vt is +5V, the driver circuit must apply +10V to the gate to turn on the low-side transistor. If VB_INT is −4V, the driver circuit must apply +1V to the gate to turn on the low-side transistor. Also, if VB_INT is −4V and Vout is 15 V, the voltage across the low-side transistor rises to 19V.

One approach to mitigate the effects of the ground bounce voltage VB_INT is to use additional circuitry which tracks VB_INT and applies a corresponding gate-to-source voltage to turn on the low-side transistor and also to use a higher-rated transistor that can withstand high voltage drops between the drain and the source.

SUMMARY

In one aspect, a driver system operable to supply a drive signal to a motor includes a system input adapted to be coupled to an input voltage and a system output adapted to be coupled to the motor. The driver system includes a high-side transistor which has a first terminal coupled to the system input, a second terminal coupled to the system output, and has a control terminal. The driver system includes a low-side transistor which has a first terminal coupled to the system output, a second terminal coupled to a reference potential terminal, and has a control terminal. The driver system includes a low-side gate control circuit which has a first input coupled to the system output, a second input adapted to receive an upper reference voltage, a third input adapted to receive a low-side digital control signal, a fourth input adapted to be coupled to a voltage supply, and has an output coupled to the control terminal of the low-side transistor. The low-side gate control circuit provides, at the output of the low-side gate control circuit, a first level current responsive to the low-side digital control signal transitioning from a low state to a high state and provides a second level current, greater than the first level current, if drive signal is less than the upper reference voltage.

In an additional aspect, the low-side gate control circuit maintains the first level current to reduce an induced ground bounce voltage at the reference potential terminal until the drive signal falls below the upper reference voltage.

In an additional aspect, the low-side gate control circuit maintains the first level current to reduce the induced ground bounce voltage at the reference potential terminal by reducing the rate of change of current through the low-side transistor until the drive signal falls below the upper reference voltage.

In an additional aspect, the low-side gate control maintains the first level current which is lower than the second level current to reduce the rate of change of current through the low-side transistor until the drive signal falls below the upper reference voltage.

In an additional aspect, the low-side gate control circuit provides the second level current when the low-side transistor transitions to a Miller region.

In an additional aspect, the low-side gate control provides a third level current to the control terminal of the low-side transistor to turn off the low-side transistor responsive to the low-side digital control signal transitioning from the high state to the low state.

In an additional aspect, the low-side gate control circuit includes a first comparison circuit which has a first input coupled to the system output, and a second input adapted to receive the upper reference voltage. The first comparison circuit provides a slew start signal at an output responsive to the drive signal falling below the upper reference voltage.

In an additional aspect, the low-side digital control circuit includes a reverse recovery current source which has a first terminal adapted to be coupled to the voltage supply and has a second terminal. The low-side gate control circuit includes a reverse recovery switch which has a first terminal coupled to the second terminal of the reverse recovery current source, a second terminal coupled to the control terminal of the low-side transistor, a third terminal coupled to the output of the first comparison circuit, and a fourth terminal adapted to receive the low-side digital control signal. The reverse recovery switch couples the reverse recovery current source to the control terminal of the low-side transistor responsive to the low-side digital control signal transitioning from the low state to the high state, and disconnects the reverse recovery current source from the control terminal of the low-side transistor responsive to an assertion of the slew start signal by the first comparison circuit.

In an additional aspect, the low-side gate control circuit includes a first slew current source which has a first terminal coupled to the voltage supply and has a second terminal. The low-side gate control circuit includes a first slew current switch which has a first terminal coupled to the second terminal of the first slew current source, a second terminal coupled to the control terminal of the low-side transistor, a third terminal coupled to the output of the first comparison circuit, and a fourth terminal adapted to receive the low-side digital control signal. The first slew current switch couples the first slew current source to the control terminal of the low-side transistor responsive to the assertion of the slew start signal by the first comparison circuit.

In an additional aspect, the low-side gate control circuit includes a second slew current source which has a first terminal coupled to the reference potential terminal and has a second terminal. The low-side gate control circuit includes a second slew current switch which has a first terminal coupled to the control terminal of the low-side transistor, a second terminal coupled to the second terminal of the second slew current source, and a third terminal adapted to receive the low-side digital control signal. The second slew current switch couples the second slew current source to the control terminal of the low-side transistor to turn off the low-side transistor responsive to the digital control signal transitioning from the high state to the low state.

In an additional aspect, a driver system operable to supply an output voltage to a motor includes a system input adapted to be coupled to input voltage and a system output adapted to be coupled to the motor. The driver system includes a high-side transistor which has a first terminal coupled to the system input, a second terminal coupled to the system output, and has a control terminal. The driver system includes a low-side transistor which has a first terminal coupled to the system output, a second terminal coupled to a reference potential terminal, and has a control terminal. The driver system includes a low-side gate control circuit which has a first input coupled to the system output, a second input adapted to receive an upper reference voltage, a third input adapted to receive a low-side digital control signal, a fourth input adapted to be coupled to a voltage supply, and has an output coupled to the control terminal of the low-side transistor. The low-side gate control circuit provides a first level current to the control terminal of the low-side transistor and maintains the first level current to the control terminal of the low-side transistor to reduce ground bounce voltage at the reference potential terminal until output voltage falls below the upper reference voltage, and provides a second level current to the control terminal of the low-side transistor responsive to an assertion of a slew start signal.

BRIEF DESCRIPTION OF THE DRAWINGS

The same reference numerals or other feature designators are used in the drawings to designate the same or similar (functionally and/or structurally) features.

DETAILED DESCRIPTION

Figure 1:
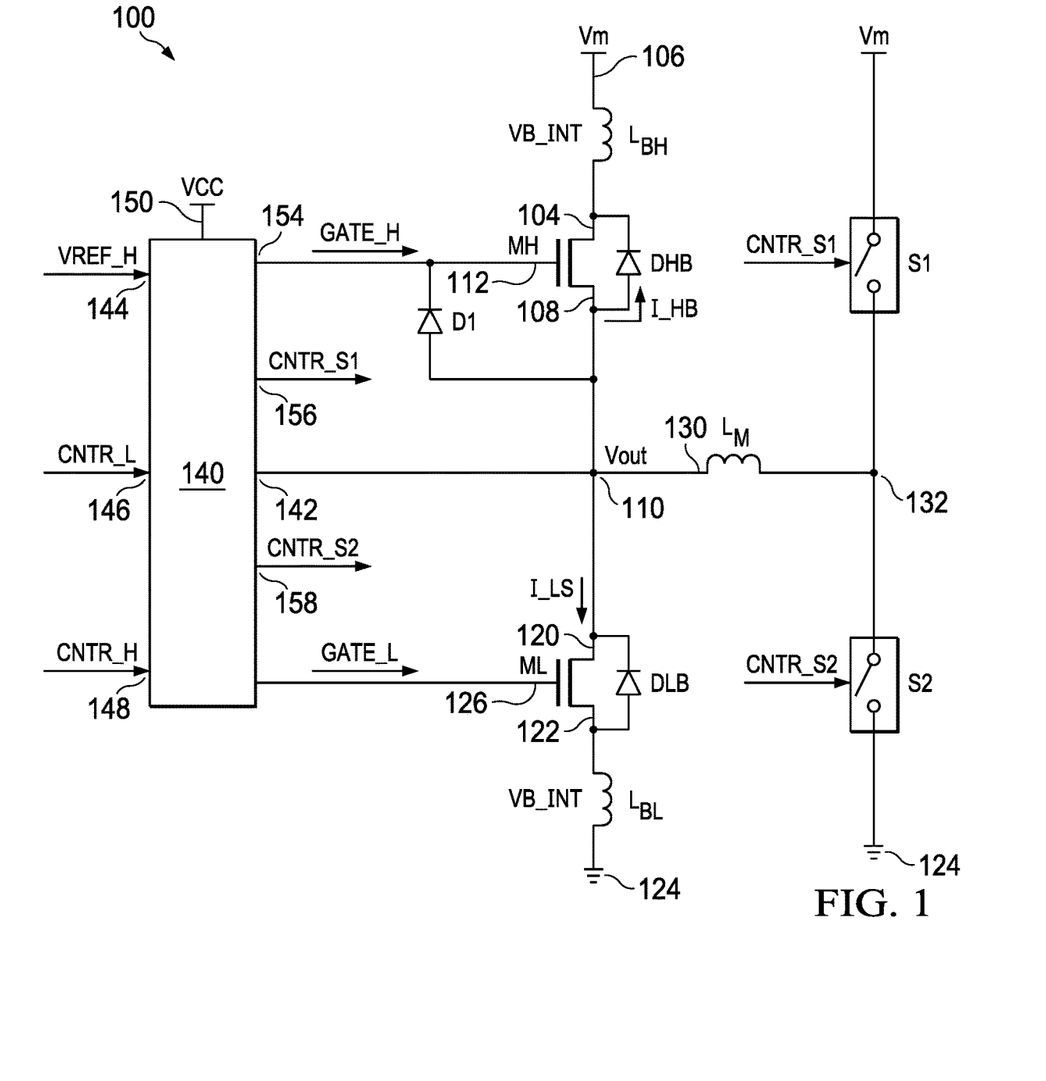
FIG. 1 is a schematic diagram of a driver system of an example embodiment.

FIG. 1 illustrates a driver system 100 of an example embodiment. The system 100 includes a high-side transistor MH which has a first terminal 104 (e.g., drain) coupled to an input 106. The high-side transistor MH has a second terminal 108 (e.g., source) coupled to an output 110. The high-side transistor MH has a control terminal 112 (e.g., gate). The high-side transistor MH includes a body diode DHB with the anode coupled to the source 108 and the cathode coupled to the drain 104.

In some embodiments, the driver system 100 can be implemented in an integrated circuit (IC). A bond wire inductance LBH (e.g., 1 nano-Henry) is present due to the bond wire which connects the first terminal 104 (e.g., drain) to an external connector (e.g., external pin of IC) which is designated as the input 106. A diode D1 has the anode coupled to the source 108 and the cathode coupled to the gate 112. In a bridge driver circuit, the diode D1 is typically connected between the gate 112 and the source 108 of the high-side transistor MH to limit gate-to-source voltage of MH from falling too far below zero (i.e., too negative), which may cause reliability issues when MH is turned off.

The system 100 includes a low-side transistor ML which has a first terminal 120 (e.g., drain) coupled to the second terminal 108 and to the output 110. The low-side transistor ML has a second terminal 122 (e.g., source) coupled to a common potential terminal 124 (e.g., electrical ground). The low-side transistor ML has a control terminal 126 (e.g., gate). The low-side transistor ML includes a body diode DLB with the anode coupled to the second terminal 122 (e.g., source) and the cathode coupled to the first terminal 120 (e.g., drain). A bond wire inductance LBL (e.g., 1 nano-Henry) is present between the source 122 and an external connector designated as the common potential terminal 124.

The input 106 can be coupled to an input voltage Vm (e.g., 12V, 25V, 40V) and the reference potential terminal 124 can be coupled to an electrical ground.

In some example embodiments, the transistors are n-channel field effect transistors (NFETs), and in another example embodiment, the transistors are p-channel field effect transistors (PFETs). In some example embodiments, the transistors may be bipolar transistors and/or other types of power transistors (e.g., drain extended FETs). In some example embodiments, the FETs are implemented in/over a silicon substrate. In other example embodiments, the FETs are implemented using gallium nitride (GaN) and/or silicon carbide (SiC).

One phase of a motor, represented by an inductive load Lm, has a first terminal 130 coupled to the output 110, and has a second terminal 132 which can be coupled to the input 106 via a first switch S1 or can be coupled to ground via a second switch S2. Depending on the number of phases (each phase may be determined by the number of winding pairs that are wrapped around a portion of the stator of the motor) used to drive the motor, additional features (e.g. MH, ML, S1 and S2) are connected to drive each phase of the motor. To drive the motor Lm in one direction, a gate signal GATE_H is applied to the gate 112 to turn on the high-side transistor MH, the low-side transistor ML is turned off (i.e., a gate signal GATE_L is not applied to the gate 126), the switch S2 is turned on (i.e., closed/conducting) and the switch S1 is turned off (i.e., opened/non-conducting). As a result, current Im flows from Vm through MH, then through the motor Lm, and finally through the switch S2 to ground. To drive the motor Lm in the reverse direction, the gate signal GATE_L is applied to the gate 126 of ML, the high-side transistor MH is turned off (i.e., gate signal GATE_H is not applied to the gate 112), the switch S1 is turned on (i.e., closed/conducting), and the switch S2 is turned off (i.e., opened/non-conducting). As a result, current Im flows from Vm through the switch S1, then through the motor Lm, and finally through ML to ground. In an example embodiment, the gate signals GATE_H and GATE_L may be pulse width modulated (PWM) signals (which have varying pulse widths) or pulse frequency modulated (PFM) signals (which have a varying frequency but a fixed amplitude).

The system 100 includes a control circuit 140 which has a first input 142 coupled to the output 110, a second input 144 coupled to receive an upper reference voltage VREF_H, a third input 146 coupled to receive a low-side digital control signal CNTR_L, a fourth input 148 coupled to receive a high-side digital control signal CNTR_H, and a fifth input 150 coupled to a voltage supply VCC (e.g., 5V, 7V). In some example embodiments, the signals 144, 146 and/or 148 are provided by external inputs (e.g. user defined inputs) or by a controller (including, for example, a processor, state machine, digital logic, analog circuitry, memory and/or an application specific integrated circuit) that may be included on the same integrated circuit (IC) as MH and ML or may be implemented on a different IC. The low-side digital control signal CNTR_L provides the timing for the low-side transistor ML, and the high-side digital control signal CNTR_H provides the timing for the high-side transistor MH. The control circuit 140 provides the gate signal GATE_L at an output 152 which is coupled to the gate 126 of the low-side transistor ML, and provides the gate signal GATE_H at an output 154 which is coupled to the gate 112 of the high-side transistor MH. Also, the control circuit 140 provides a control signal CNTR_S1 at an output 156 to control the switch S1, and provides a control signal CNTR_S2 at an output 158 to control the switch S2.

In some example embodiments, the control circuit 140 mitigates the effect of the induced voltage VB_INT without requiring additional circuitry and/or higher-rated transistors. The control circuit 140 applies a first level current (also referred to as reverse recovery current) to the gate 126 of ML during a reverse recovery period and then increases the current to a second level current (referred to as slew current) when the output voltage Vout falls below the upper reference voltage VREF_H, which indicates ML has transitioned to the Miller region.

Figure 2:
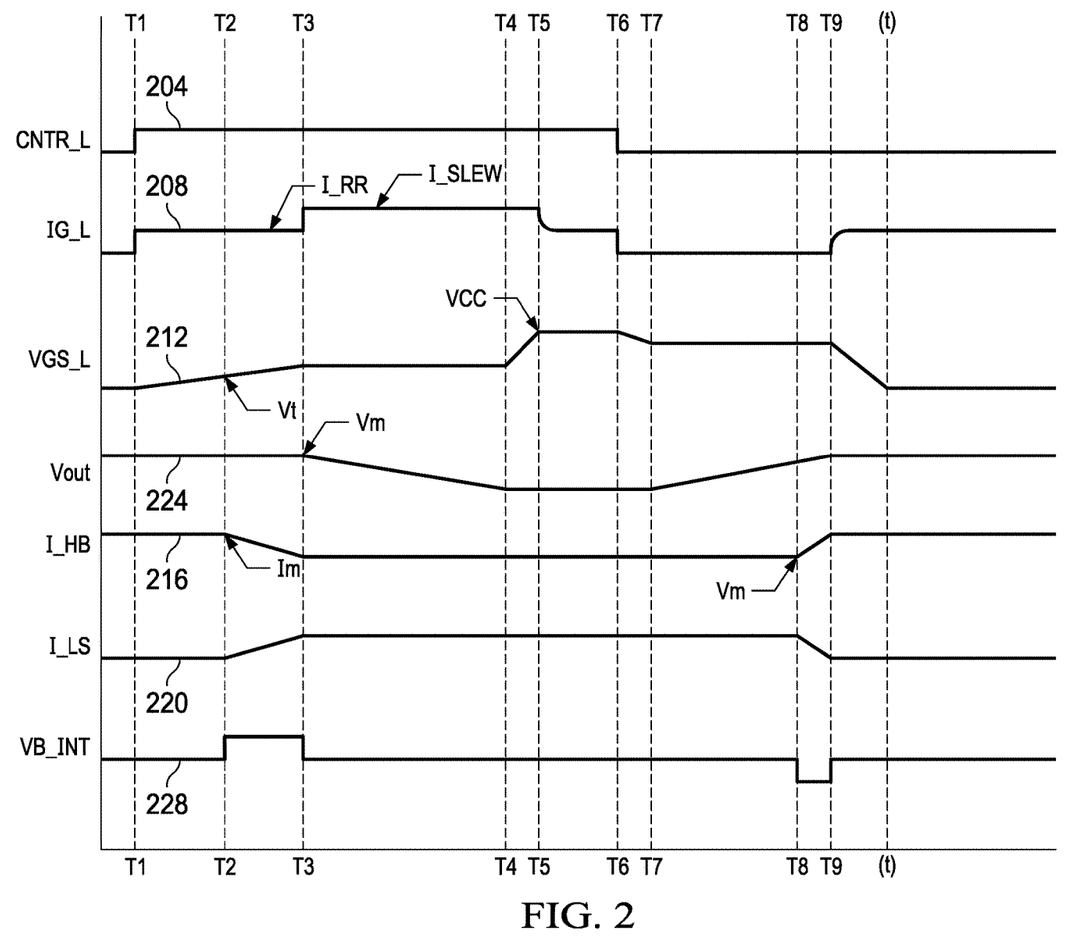
FIG. 2 are waveforms generated by the driver system of FIG. 1.

FIG. 2 illustrates waveforms used in or generated by the driver system 100. The x-axis represents time and the y-axis represents voltage with respect to voltage waveforms and current with respect to current waveforms. At time T1, a low-side digital control signal CNTR_L 204 transitions from a low state to a high state to start the process of turning on the low-side transistor ML. In response, the control circuit 140 applies a gate current I_GL 208 which has a magnitude equal to a first level current I_RR (also referred to as reverse recovery current I_RR) to the gate 126 of ML. In some example embodiments, I_RR is approximately 500 micro-Amps (500 uA). In accordance with some example embodiments, the magnitude of I_RR is chosen so that I_RR is sufficiently low to limit the reverse recovery period of the high-side body diode DHB but also adequate to prevent significant propagation delay (time required to turn on ML). As discussed before, when ML is turned on, S1 is closed (conducting), MH is turned off, and S2 is opened (not conducting).

In response to I_RR, a gate-to-source voltage V_GSL 212 of ML begins to rise. Because ML is still turned off at time T1, motor current Im flows through the high-side body diode DHB from the anode to the cathode. Thus, at time T1, a current I_HB 216 (flowing through the high-side body diode DHB) is equal to motor current Im, and a current I_LS 220 (flowing through the low-side transistor ML) is zero. At time T1, an output voltage Vout 224 is equal to (Vm+VDH), where VDH is the voltage across the high-side body diode DHB. Depending on the size of the body diode DHB, the voltage VDH can vary (e.g, 0.7V, 0.9V, 1.2V).

At time T2, the gate-to-source voltage VGS_L 212 rises above the threshold voltage, Vt, required to turn on ML. Thus, the current I_LS 220 through ML begins to rise. Although at time T2, ML is turned on, due to the reverse recovery time of the high-side body diode DHB, the current I_HB 216 continues to flow through DHB but starts to decrease as the current I_LS 220 starts to rise through ML.

At time T2, the output voltage Vout 224 begins to fall, and at time T3, Vout 224 falls below Vm. In response, at time T3 the control circuit 140 increases the gate current I_GL from a first level current (reverse recovery current I_RR) to a second level current (slew current I_SLEW). Thus, the control circuit 140 maintains a lower gate current (reverse recovery current I_RR) until Vout falls below Vm, and thereafter increases to a higher gate current (slew current I_SLEW). In some example embodiments, I_SLEW is approximately 5 mA for a slew rate of around 100V/us (100 volts per micro-second).

At time T3, the high-side body diode DHB is reverse biased, and as a result current I_HB 216 through the high-side body diode DHB falls to zero and motor current Im flows from Vm through S1 and then through Lm and finally through ML. As discussed before, when ML is turned on, MH is turned off, S1 is closed (conducting) and S2 is opened (not conducting).

The control circuit 140 slowly charges the gate 126 of ML by maintaining the lower gate current (reverse recovery current) until ML transitions to the Miller region at time T3 and DHB is reverse biased. As a result, a sharp rise in current I_LS 220 through ML is prevented, which significantly reduces a ground bounce voltage VB_INT 228 between T2 and T3. In the example of FIG. 2, the ground bounce voltage VB_INT 228 refers to the ground bounce voltage at the source 122 of ML (shown in FIG. 1), and in some example embodiments the ground bounce voltage is limited to around 1V.

At time T3, the low-side transistor ML transitions to the Miller region which causes a gate-to-drain capacitor CGD (not shown) of ML to start charging. As a result, at time T3, the gate-to-source voltage VGS_L 212 flattens (e.g., plateaus).

At time T4, the gate-to-drain capacitor CGD is charged at which time the low-side transistor ML transitions to the FET enhancement region. As a result, at time T4 the gate-to-source voltage VGS_L 212 starts to rise again, reaching VCC (e.g, approximately 5V) at time T5. Because at time T4 the gate-to-drain capacitor CGD is charged, the gate current IG_L 208 begins to fall.

At time T6, the low-side digital control signal CNTR_L transitions from the high state to the low state to turn off the low-side transistor ML. In response, at time T6 the control circuit 140 applies the gate current IG_L 208 having a magnitude I_SLEW but of negative polarity (e.g., −I_SLEW) which is also referred to as a "pull-down current". As a result, at time T7, VGS_L 212 falls back to the same voltage level as the level in the Miller region (i.e., between T3 and T4).

At time T7, the output voltage Vout 224 slews upward and at time T8, Vout 224 rises above Vm which causes the current I_HB 216 (e.g. the current through the high-side body diode IHB) to start rising. As the current I_HB 216 rises, the current IL_S 220 (e.g. current through the low-side transistor ML) starts to fall. At time T9, current I_LS 220 falls to zero, and, as a consequence, I_HB 216 becomes equal to Im.

Because the current I_LS 220 decreases between T8 and T9, the negative rate of change of current through ML induces the negative ground bounce voltage VB_INT 228 between T8 and T9. In some example embodiments, the magnitude of the negative ground bounce voltage can be limited by decreasing the magnitude (i.e., less negative) of the pull down current −I_SLEW in a similar way the magnitude of the ground bounce voltage VB_INT1 228 is limited between T2 and T3.

Figure 3:
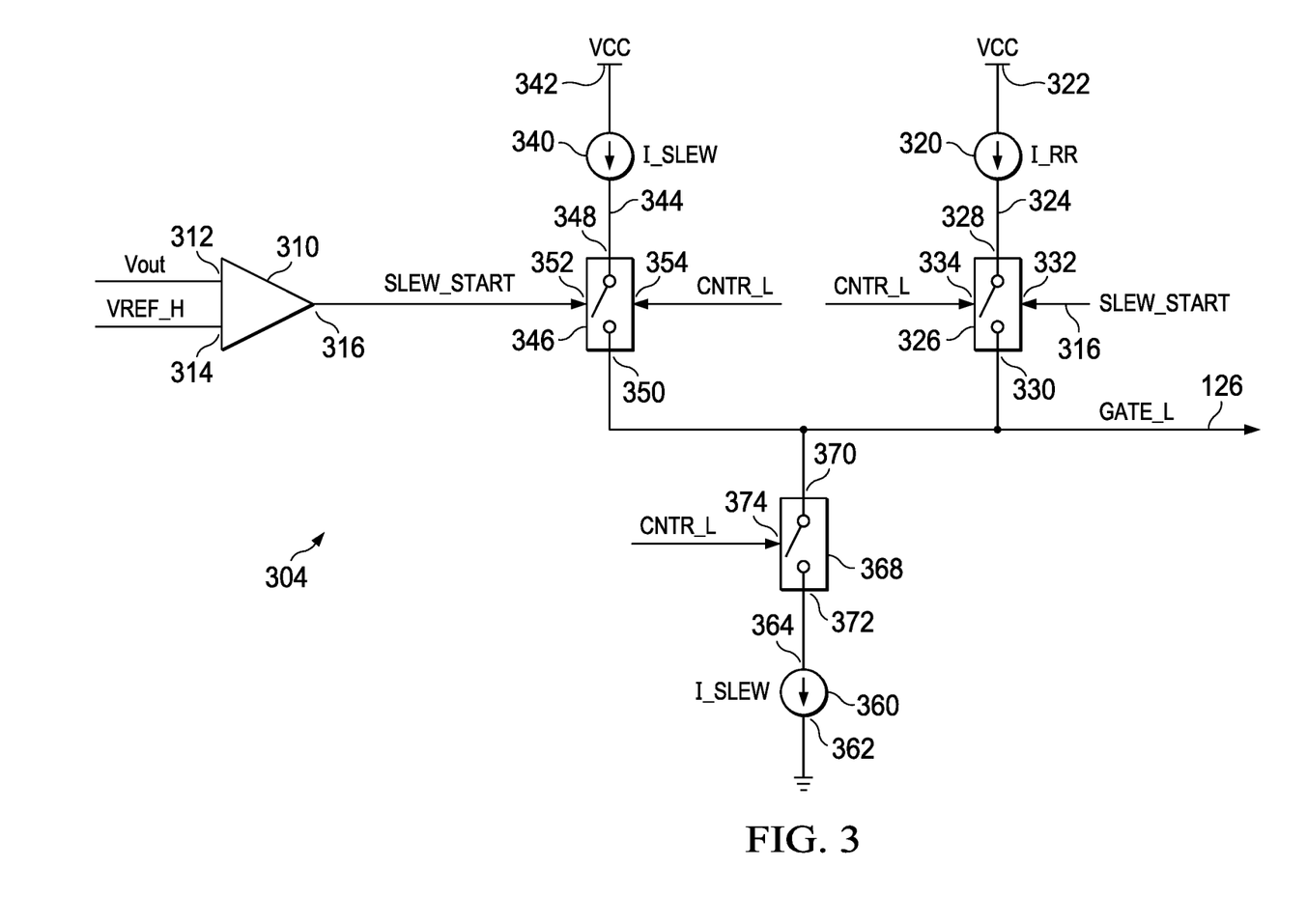
FIG. 3 is a block diagram of a control circuit of an example embodiment.

FIG. 3 illustrates a low-side gate drive circuit 304 of the control circuit 140 of an example embodiment. The low-side gate drive circuit 304 provides the gate signal GATE_L to the gate 126 to drive ML (shown in FIG. 1). The control circuit 140 also includes a high-side gate drive circuit (not shown in FIG. 3) which provides the gate signal GATE_H to drive MH (shown in FIG. 1).

The low-side gate drive circuit 304 includes a first comparison circuit 310 which has a first input 312 (e.g., input 142 of FIG. 1) coupled to the system output 110, a second input 314 (e.g., input 144 of FIG. 1) adapted to receive the upper reference voltage VREF_H (e.g. input 144 of FIG. 1). The first comparison circuit 310 provides a slew start signal SLEW_START at an output 316 if the output voltage Vout falls below the upper reference voltage VREF_H.

The low-side gate drive circuit 304 includes a first current source 320 (also referred to as reverse recovery current source 320) which has a first terminal 322 coupled to the voltage supply VCC. The first current source 320 provides a first level current I_RR (also referred to as reverse recovery current I_RR) at an output 324.

The low-side gate drive circuit 304 includes a first switch 326 (also referred to as reverse recovery switch 326) which has a first terminal 328 coupled to the second terminal 324 of the first level current source 320 (reverse recovery current source 320), a second terminal 330 coupled to the gate 126 of the low-side transistor ML (not shown in FIG. 3), a third terminal 332 coupled to the output 316 of the first comparison circuit 310, and a fourth terminal 334 coupled to receive the low-side digital control signal CNTR_L. The first current switch 326 couples the first current source 320 to the gate 126 of ML responsive to CNTR_L transitioning from a low state to a high state and disconnects the first level current source 320 from the gate 126 of ML responsive to an assertion of the slew start signal SLEW_START by the first comparison circuit 310.

The low-side gate drive circuit 304 includes a second current source 340 (also referred to as slew current source 340) which has a first terminal 342 coupled to the voltage supply VCC. The second level current source 340 provides a second level current I_SLEW (also referred to as slew current I_SLEW) at an output 344. The second level current I_SLEW is greater than the first level current I_RR.

The low-side gate drive circuit 304 includes a second switch 346 (also referred to as slew current switch 346) which has a first terminal 348 coupled to the output 344 of the slew current source 340, a second terminal 350 coupled to the gate 126 of ML, a third terminal 352 coupled to the output 316 of the first comparison circuit 310, and a fourth terminal 354 coupled to receive the low-side digital control signal CNTR_L. The slew current switch 346 couples the slew current source 340 to the gate 126 of ML responsive to the assertion of the slew start signal SLEW_START by the first comparison circuit 310.

The low-side gate drive circuit 304 includes a third current source 360 which has a first terminal 362 coupled to the common potential (e.g. ground) terminal and has a second terminal 364. The low-side gate drive circuit 304 includes a third switch 368 which has a first terminal 370 coupled to the gate 126 of ML, a second terminal 372 coupled to the second terminal 364 of the second current source 360, and a third terminal 374 coupled to receive the low-side digital control signal CNTR_L. The third switch 368 couples the third current source 360 to the gate 126 responsive to CNTR_L transitioning from the high state to the low state. As a result, the gate 126 is discharged to ground by the slew current source 370 and ML is turned off.

The low-side gate drive circuit 304 maintains a lower level gate current (reverse recovery current I_RR) until the output voltage Vout falls below VREF_H which indicates the low-side transistor ML has transitioned to the Miller region and the high-side body diode DHB is reverse-biased. Thereafter, the low-side gate drive circuit 304 increases the gate current to a higher level (slew current I_SLEW) which allows the gate-to-drain capacitor CGD (not shown in FIG. 3) to be charged in the Miller region.

In some example embodiments, the low-side gate drive circuit 304 slowly charges the gate 126 of ML by maintaining the lower gate current (reverse recovery current I_RR) until ML transitions to the Miller region and DHB is reverse biased. As a result, a sharp rise in current I_LS 220 (FIG. 2) through ML is prevented, which significantly reduces the ground bounce voltage VB_INT 224. Also, by slowly charging the gate 126 of ML by maintaining the reverse recovery current until the high-side body diode DHB is reverse biased, the control circuit 140 prevents the current I_BH 216 (FIG. 2) through the high-side body diode DHB from falling below zero. Thus, DHB is reverse biased relatively slowly without the need for current to flow in the reverse direction through DHB. As a result, in some example embodiments, the current I_LS through ML does not rise above Im (FIG. 2) and thus does not fall down to Im. Because the current I_LS does not have a negative rate of change, the induced ground bounce voltage VB_INT does not become negative. Thus, the induced voltage VB_INT is characterized by a positive pulse. The effect of this is that a wide swing in the induced ground bounce voltage VB_INT is prevented and the voltage drop between the drain 120 and the source 122 of ML is reduced.

In some example embodiments, I_RR can be adjusted (e.g., increased) to allow I_LS to rise above Im but limit the amount I_LS rises above Im, and also to allow VB_INT to fall below zero but limit the amount VB_INT falls below zero.

In response to CNTR_L transitioning from the high state (e.g. a binary "1" such as a higher voltage level) to the low state (e.g. a binary "0" such as a lower voltage level), the third switch 374 couples the slew current source 360 to the gate 126 ML. As a result, the gate 126 is discharged to ground by the slew current source 360.

Figure 4:
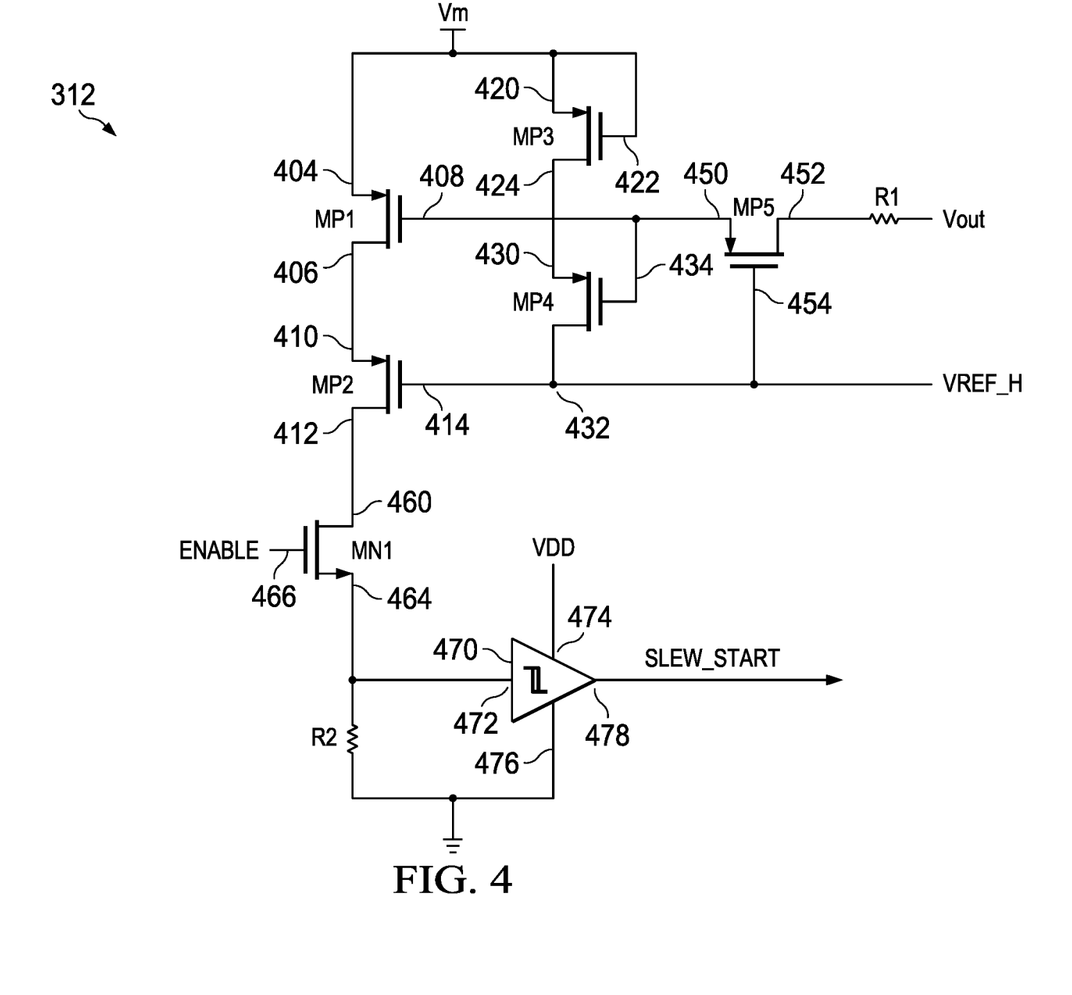
FIG. 4 is a schematic diagram of a comparison circuit of an example embodiment.

FIG. 4 illustrates the comparison circuit 312 in accordance with an example embodiment. The comparison circuit 312 includes a first PMOS transistor MP1 which includes a source 404 coupled to the input voltage Vm, and includes a drain 406 and a gate 408. The comparison circuit 312 includes a second PMOS transistor MP2 which includes a source 410 coupled to the drain 406 of MP1, and includes a drain 412 and a gate 414. The comparison circuit 312 includes third PMOS MP3 which includes a source 420 coupled to Vm and to a gate 422 and includes a drain 424.

The comparison circuit 312 includes a fourth PMOS MP4 which includes a source 430 coupled to the drain 424 of MP3 and includes a gate 434 coupled to the gate 408 of MP1. MP4 includes a drain 432 adapted to receive the upper reference voltage VREF_H and also coupled to the gate 414 of MP2. The comparison circuit 312 includes a fifth PMOS MP5 which includes a source 450 coupled to the gate 408 of MP1 and includes a source 452 coupled to output voltage Vout via a resistor R1. MP5 includes a gate 454 adapted to receive the upper reference voltage VREF_H. The comparison circuit 312 includes an NMOS transistor MN1 which includes a drain 460 coupled to the drain 414 of MP2, and includes a source 464 coupled to ground via a resistor R2. MN1 includes a gate 466 adapted to receive an enable signal ENABLE. In some example embodiments, the enable signal ENABLE is derived from CNTR_L. For example, the enable signal ENABLE may be asserted if CNTR_L transitions from a low state to a high state, and the ENABLE may be de-asserted if CNTR_L transitions from a high state to a low state.

The comparison circuit 312 includes a comparator 470 which includes a first input 472 coupled to the source 464 of MN1, a second input 474 coupled to a voltage supply VDD, and a third input 476 coupled to ground. The resistor R2 is coupled between the first input 472 and ground.

In an example embodiment, the comparator 470 is a Schmitt Trigger which includes a hysteresis loop defined by VDD and ground. The comparator 470 provides SLEW_START at an output 478. In some example embodiments, MP2 may be implemented using a drain extended MOSFET (DENMOS) so as to protect MP1 which is a low voltage device. MN1 may be implemented using a DENMOS so as to protect the Schmitt Trigger 470.

In some embodiments, VREF_H is approximately equal to Vm minus five volts (Vm−5V). When Vout is greater than Vm plus the threshold voltage of the transistor minus five volts (Vm−5V+Vt), MP5 conducts, thus coupling the gate 408 of MP1 to Vout. As a result, MP1 conducts. As Vout starts to fall to approximately Vm, MP1 does not conduct and the resistor R2 pulls down the first input 472 of the Schmitt Trigger 470 to ground. This results in the output 478 (SLEW_START) of the Schmitt Trigger 470 to become at or near zero volts. In response, I_RR is applied by the control circuit 140 (not shown in FIG. 4) to the gate 126 of the low-side transistor ML.

When Vout is less than Vm minus the threshold voltage of the transistor (Vm−Vt) (e.g., Vout falls more than Vt below Vm), MP1 conducts, and the source 464 of MN1 is pulled up to a value of approximately the voltage of the ENABLE signal minus the gate-to-source voltage of the MN1 (ENABLE−Vgs), which causes the Schmitt Trigger 470 to assert SLEW_START (e.g., SLEW_START becomes a logical high or "1" value) and the slew current I_SLEW is supplied to the gate 126 of the low side transistor ML. When Vout is less than Vm minus approximately five volts (Vm−5V), the body diode (not shown in FIG. 4) of MP4 conducts and holds the source 450 of MP5 to one diode voltage drop below Vm−5V, thereby preventing Vgs of MP5 VGS from rising too high (e.g., too positive).

In the foregoing discussion and in the claims, the terms "including" and "comprising" are used in an open-ended fashion, and thus should be interpreted to mean "including, but not limited to . . . ." An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure.

Unless otherwise stated, "approximately" preceding a value means +/−10 percent of the stated value. As used herein, the term "modulate" shall also mean "to vary" or "to change."

The terms "node", "terminal", "pin" and "interconnection", for example, are interchangeably used and referred to any connection (or interconnection) between features. These terms are not meant to be limiting with respect to a certain type of physical structure. For example, the "terminals" of a circuit element are meant to be each connection to such circuit element. Hence, an integrated resistor would be referred to have two terminals (ends) even though these "terminals" are just the two connections to the integrated resistor.

While the use of particular transistors are described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (S1), a silicon carbide substrate (SiC), a gallium nitride substrate (GaN) or a gallium arsenide substrate (GaAs).

While some example embodiments suggest that certain elements are included in an integrated circuit while other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A driver system comprising:
a high-side transistor having a first terminal and having a control terminal;
a low-side transistor having a first terminal coupled to the first terminal of the high-side transistor and having a control terminal; and
a gate control circuit having
a first input coupled to the first terminals of the high-side and low-side transistors,
a reference voltage input,
a digital control input,
a voltage supply input, and an output coupled to the control terminal of the low-side transistor; and
wherein the gate control circuit is operable to provide, at the output of the gate control circuit, a first level current responsive to a low-side digital control signal at the digital control input transitioning from a low state to a high state and provide a second level current, greater than the first level current, responsive to a drive signal at the first terminals of the high-side and low-side transistors being less than a reference voltage at the reference voltage input.

2. The system of claim 1, wherein the gate control circuit is operable to maintain the first level current to reduce an induced ground bounce voltage at a reference potential terminal coupled to the second terminal of the low-side transistor until the drive signal falls below the reference voltage.

3. The system of claim 1, wherein the gate control circuit is operable to maintain the first level current to reduce an induced ground bounce voltage at a reference potential terminal coupled to the second terminal of the low-side transistor by reducing the rate of change of current through the low-side transistor until the drive signal falls below the reference voltage.

4. The system of claim 1, wherein the gate control circuit is operable to maintain the first level current which is lower than the second level current to reduce the rate of change of current through the low-side transistor until the drive signal falls below the reference voltage.

5. The system of claim 1, wherein the gate control circuit is operable to provide the second level current responsive to the low-side transistor transitioning to a Miller region.

6. The system of claim 1, wherein the gate control circuit is operable to provide a third level current to the control terminal of the low-side transistor to turn off the low-side transistor responsive to the low-side digital control signal transitioning from the high state to the low state.

7. The system of claim 1, wherein the gate control circuit comprises a first comparison circuit having a first input coupled to the first terminals of the high-side and low-side transistors, having the reference voltage input, and having an output, the first comparison circuit operable to provide a slew start signal at the output of the first comparison circuit responsive to the drive signal falling below the reference voltage.

8. The system of claim 7, wherein the gate control circuit comprises:

a reverse recovery current source having a first terminal; and
a reverse recovery switch having a first terminal coupled to the first terminal of the reverse recovery current source, a second terminal coupled to the control terminal of the low-side transistor, a third terminal coupled to the output of the first comparison circuit, and having a fourth terminal coupled to the digital control input, the reverse recovery switch operable to couple the reverse recovery current source to the control terminal of the low-side transistor responsive to the low-side digital control signal transitioning from the low state to the high state, and to disconnect the reverse recovery current source from the control terminal of the low-side transistor responsive to the slew start signal.

9. The system of claim 7, wherein the gate control circuit comprises:
a first slew current source having a first terminal; and
a first slew current switch having a first terminal coupled to the first terminal of the first slew current source, a second terminal coupled to the control terminal of the low-side transistor, a third terminal coupled to the output of the first comparison circuit, and a fourth terminal coupled to the digital control input, the first slew current switch operable to couple the first slew current source to the control terminal of the low-side transistor responsive to the slew start signal.

10. The system of claim 9, wherein the gate control circuit comprises:
a second slew current source having a first terminal;
a second slew current switch having a first terminal coupled to the control terminal of the low-side transistor, a second terminal coupled to the first terminal of the second slew current source, and a third terminal coupled to the digital control input, the second slew current switch operable to couple the second slew current source to the control terminal of the low-side transistor to turn off the low-side transistor responsive to the digital control signal transitioning from the high state to the low state.

11. The system of claim 1, further comprising:
a high-side body diode having a cathode coupled to a second terminal of the high-side transistor and having an anode coupled to the first terminal of the high-side transistor; and
a low-side body diode having a cathode coupled to a second terminal of the low-side transistor and having an anode coupled to the first terminal of the low-side transistor.

12. A driver system comprising:
a high-side transistor having a first terminal and having a control terminal;
a low-side transistor having a first terminal coupled to the first terminal of the high-side transistor and having a control terminal; and
a gate control circuit having
a first input coupled to the first terminals of the high-side and low-side transistors,
a reference voltage input,
a digital control input,
a voltage supply input, and
an output coupled to the control terminal of the low-side transistor; and
wherein the gate control circuit is operable to apply a first level current to the control terminal of the low-side transistor and to maintain the first level current to the control terminal of the low-side transistor until an output voltage at the first terminals of the high-side and low-side transistors falls below a reference voltage at the reference voltage input and operable to apply a second level current, that is greater than the first level current, to the control terminal of the low-side transistor responsive to a slew start signal.

13. The system of claim 12, wherein the gate control circuit is operable to maintain the first level current which is less than the second level current to reduce the rate of change of current through the low-side transistor until the output voltage falls below the reference voltage.

14. The system of claim 12, wherein the gate control circuit is operable to provide a third level current to turn off the low-side transistor responsive to a low-side digital control signal at the digital control input transitioning from a high state to a low state.

15. The system of claim 12, wherein the gate control circuit comprises a first comparison circuit having the first input coupled to the first terminals of the high-side and low-side transistors, having the reference voltage input, and having an output, the first comparison circuit operable to provide the slew start signal at the output of the comparison circuit responsive to the output voltage falling below the reference voltage.

16. The system of claim 12, wherein the gate control circuit comprises:
a reverse recovery current source having a first terminal; and
a reverse recovery switch having a first terminal coupled to the first terminal of the reverse recovery current source, a second terminal coupled to the control terminal of the low-side transistor, a third terminal coupled to the output of the first comparison circuit, and a fourth terminal coupled to the digital control input, the reverse recovery switch operable to couple the reverse recovery current source to the control terminal of the low-side transistor responsive to a low-side digital control signal at the digital control input transitioning from a low state to a high state and to disconnect the reverse recovery current source from the control terminal of the low-side transistor responsive to the slew start signal.

17. The system of claim 12, wherein the gate control circuit comprises:
a first slew current source having a first terminal; and
a first slew current switch having a first terminal coupled to the first terminal of the first slew current source, a second terminal coupled to the control terminal of the low-side transistor, a third terminal coupled to the output of the first comparison circuit, and a fourth terminal coupled to the digital control input, the first slew current switch operable to couple the first slew current source to the control terminal of the low-side transistor responsive to the slew start signal.

18. The system of claim 17, wherein the gate control circuit comprises:

a second slew current source having a first terminal; and
a second slew current switch having a first terminal coupled to the control terminal of the low-side transistor, a second terminal coupled to the first terminal of the second slew current source, and a third terminal coupled to the digital control input, the second slew current switch operable to couple the second slew current source to the control terminal of the low-side transistor to turn off the low-side transistor responsive to a digital control signal at the digital control input transitioning from a high state to a low state.

19. A driver system comprising:
a high-side transistor having a first terminal and a second terminal, and having a control terminal;
a low-side transistor having a first terminal coupled to the second terminal of the high-side transistor at a system ouput, having a second terminal, and having a control terminal;
a high-side body diode having a cathode coupled to the first terminal of the high-side transistor and having an anode coupled to the second terminal of the high-side transistor;
a low-side body diode having a cathode coupled to the first terminal of the low-side transistor and having an anode coupled to the second terminal of the low-side transistor; and
a gate control circuit having
a first input coupled to the system output,
a reference voltage input,
a digital control input adapted,
a voltage supply input, and
an output coupled to the control terminal of the low-side transistor;
wherein the gate control circuit is operable to apply a first level current to the control terminal of the low-side transistor responsive to a digital control signal at the digital control input transitioning from a low state to a high state and operable to maintain the first level current to the control terminal of the low-side transistor to reduce a ground bounce voltage at a reference potential terminal coupled to the second terminal of the low-side transistor by reducing the rate of change of current through the low-side transistor until an output voltage at the system output falls below a reference voltage at the reference voltage input, and operable to apply a second level current, greater than the first level current, to the control terminal of the low-side transistor responsive to a slew start signal.

20. The system of claim 19, wherein the gate control circuit is operable to apply a third level current to the control terminal of the low-side transistor to turn off the low-side transistor responsive to the digital control signal transitioning from the high state to the low state.

* * * * *